US011929354B2

(12) United States Patent
Fujii (10) Patent No.: US 11,929,354 B2
(45) Date of Patent: Mar. 12, 2024

(54) POWER SEMICONDUCTOR MODULE (71) Applicant: FUJI ELECTRIC CO., LTD., Kawasaki (JP)

(72) Inventor: Masanari Fujii, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 584 days.

(21) Appl. No.: 17/134,646

(22) Filed: Dec. 28, 2020

(65) Prior Publication Data

US 2021/0242179 A1 Aug. 5, 2021

(30) Foreign Application Priority Data

Feb. 5, 2020 (JP) ................................ 2020-017672

(51) Int. Cl.
*G01N 17/04* (2006.01)
*H01L 23/00* (2006.01)
(Continued)

(52) U.S. Cl.
CPC ......... *H01L 25/0753* (2013.01); *G01N 17/04* (2013.01); *H01L 24/32* (2013.01);
(Continued)

(58) Field of Classification Search
CPC .......... G01K 13/00; G01K 7/01; G01N 17/04; H01L 23/00; H01L 24/32; H01L 24/45;
(Continued)

(56) References Cited

U.S. PATENT DOCUMENTS

2006/0186854 A1\* 8/2006 Ho .......................... H02M 1/44
  318/799
2016/0036316 A1\* 2/2016 Momota ............ H03K 17/0828
  363/78

(Continued)

FOREIGN PATENT DOCUMENTS

CN      101424654 A   *  5/2009   ............. G01N 27/20
CN      107356521 A   * 11/2017   ............. G01N 17/02
(Continued)

OTHER PUBLICATIONS

Japanese Patent Office Action dated Nov. 21, 2023, for corresponding Japanese Patent Application No. 2020-017672.

*Primary Examiner* — Timothy J Thompson
*Assistant Examiner* — Guillermo J Egoavil
(74) *Attorney, Agent, or Firm* — Rabin & Berdo, P.C.

(57) ABSTRACT

A power semiconductor module includes a half-bridge circuit having a first power semiconductor element and a second power semiconductor element that are connected in series with each other. The power semiconductor module also includes first to third external terminals, a first wiring member that connects a high-potential-side main electrode of the first power semiconductor element to the first external terminal, a second wiring member that connects a low-potential-side main electrode of the second power semiconductor element to the second external terminal, a third wiring member that connects an output of the half-bridge circuit to a third external terminal, and at least one of a first corrosion sensor disposed in an installation environment of the first wiring member, a second corrosion sensor disposed in an installation environment of the second wiring member, or a third corrosion sensor disposed in an installation environment of the third wiring member.

14 Claims, 7 Drawing Sheets

(51) Int. Cl.
*H01L 25/075* (2006.01)
*H01L 25/18* (2023.01)
*H02M 7/00* (2006.01)
*H02M 7/5387* (2007.01)
*G01K 13/00* (2021.01)

(52) U.S. Cl.
CPC .............. *H01L 24/48* (2013.01); *H01L 24/73* (2013.01); *H01L 25/18* (2013.01); *H02M 7/003* (2013.01); *H02M 7/53871* (2013.01); *G01K 13/00* (2013.01); *H01L 2224/32225* (2013.01); *H01L 2224/48227* (2013.01); *H01L 2224/73265* (2013.01); *H01L 2924/1203* (2013.01); *H01L 2924/13055* (2013.01); *H01L 2924/14252* (2013.01)

(58) Field of Classification Search
CPC ......... H01L 24/48; H01L 24/49; H01L 24/73; H01L 25/072; H01L 25/0753; H01L 25/162; H01L 25/18; H01L 25/075; H01L 2224/0603; H01L 2224/32225; H01L 2224/45124; H01L 2224/45147; H01L 2224/48137; H01L 2224/48227; H01L 2224/4903; H01L 2224/49113; H01L 2224/73265; H01L 2924/00; H01L 2924/00014; H01L 2924/1203; H01L 2924/13055; H01L 2924/14252; H01L 2924/19105; H01L 2924/19107; H02M 1/32; H02M 7/003; H02M 7/5387; H02M 7/53871; H02M 7/00
USPC ....................................................... 361/728
See application file for complete search history.

(56) References Cited

U.S. PATENT DOCUMENTS

2016/0315038 A1\* 10/2016 Sato .................. H01L 23/49575
2017/0154877 A1\* 6/2017 Tanimoto ............ H01L 23/3735

FOREIGN PATENT DOCUMENTS

| JP | H0786279 A | \* | 3/1995 | ......... H01L 21/3205 |
|----|------------|---|--------|------------------------|
| JP | H07086279 A | | 3/1995 | |
| JP | H07128384 A | | 5/1995 | |
| JP | 2001197723 A | | 7/2001 | |
| JP | 2008243940 A | | 10/2008 | |
| JP | 2014-153089 A | | 8/2014 | |
| JP | 2014178264 A | | 9/2014 | |
| JP | 2016138784 A | | 8/2016 | |

\* cited by examiner

POWER SEMICONDUCTOR MODULE

CROSS-REFERENCE TO RELATED APPLICATION

This application is based upon and claims the benefit of priority of the prior Japanese Patent Application No. 2020-017672, filed on Feb. 5, 2020, the entire contents of which are incorporated herein by reference.

BACKGROUND OF THE INVENTION

1. Field of the Invention

The embodiments discussed herein relate to a power semiconductor module.

2. Background of the Related Art

For example, power conversion inverter circuits include power semiconductors as switching elements. Insulated gate bipolar transistors (IGBTs) or metal-oxide-semiconductor field-effect transistors (MOSFETs) are generally used as these power semiconductors. The power semiconductors are incorporated into a single package to constitute a power semiconductor module. There are cases in which a power semiconductor module includes one or more power semiconductors. These power semiconductor modules have evolved to intelligent power modules (IPMs). An IPM includes a drive circuit for driving an individual power semiconductor and a control circuit including peripheral circuits such as various kinds of protection circuits.

There are known a power semiconductor module whose power semiconductors are sealed by resin and a power semiconductor module whose power semiconductors or the like housed in a package are covered by gel to achieve insulation. There are many cases in which power semiconductor modules are used in a poor environment including corrosive gas such as hydrogen sulfide. However, the above resin and gel are used to achieve electrical insulation, not to block gas. Thus, corrosive gas that naturally exists in the air unavoidably permeates the resin and gel.

In the case of a power semiconductor module sealed by resin, even if wires or the like that connect internal power semiconductors are corroded by corrosive gas that has permeated the resin, the corrosion state is not seen from the outside. Thus, if the power semiconductor module having such corroded wires or the like is continuously used, the power semiconductor module could suddenly stop its operation at unexpected timing.

In the case of a power semiconductor module whose power semiconductors or the like are covered by gel, the corrosion state is visually observable via the transparent gel by removing a cover. However, how the corrosion progresses is not objectively determinable. Thus, the power semiconductor module whose power semiconductors or the like are covered by gel could also suddenly stop its operation at unexpected timing if the power semiconductors or the like are corroded.

There is known a corrosion sensor for detecting how the corrosion progresses (see, for example, Japanese Laid-open Patent Publication No. 2014-153089). This corrosion sensor includes a plurality of series circuits connected in parallel with each other, each of the series circuits being formed by a combination of a metal having a corrosion rate as a calculation target and a fixed resistor. This technique calculates how much time it takes for the plurality of metals to be corroded and disconnected in an exposure environment by combining the metals having corrosion rates as the calculation targets based on the resistance values of the corresponding fixed resistors.

However, since the conventional corrosion sensor needs a plurality of kinds of metals having different corrosion rates, it is difficult to install the corrosion sensor inside a power semiconductor module in view of space. Also, it is difficult to select the installation location.

SUMMARY OF THE INVENTION

In one aspect of the embodiments, there is provided a power semiconductor module including: a half-bridge circuit including a first power semiconductor element and a second power semiconductor element that are connected in series with each other; a first external terminal, a second external terminal, and a third external terminal; a first wiring member that connects a high-potential-side main electrode of the first power semiconductor element to the first external terminal; a second wiring member that connects a low-potential-side main electrode of the second power semiconductor element to the second external terminal; a third wiring member that connects an output of the half-bridge circuit to the third external terminal; and at least one of a first corrosion sensor disposed in an installation environment of the first wiring member, a second corrosion sensor disposed in an installation environment of the second wiring member, or a third corrosion sensor disposed in an installation environment of the third wiring member.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described in detail with reference to the accompanying drawings, based on examples in which a module or an IPM using IGBTs as power semiconductors is used. Like reference characters denote like elements throughout the accompanying drawings. In addition, an individual embodiment may be realized by partially combining a plurality of embodiments, as long as the combination does not cause contradiction.

First Embodiment

Figure 1:
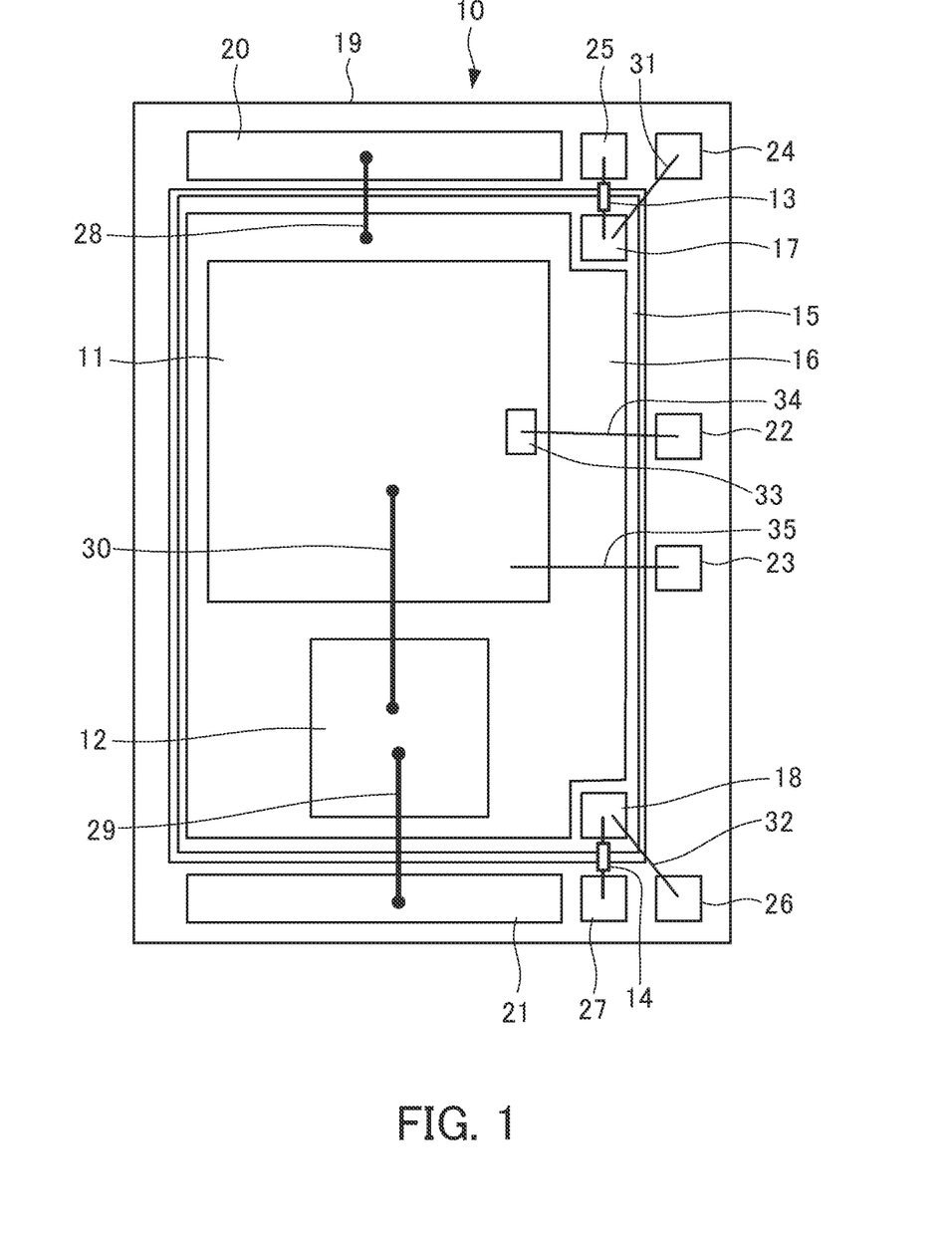
FIG. 1 is a plan view illustrating an example of an internal configuration of a power semiconductor module according to a first embodiment.
Figure 2:
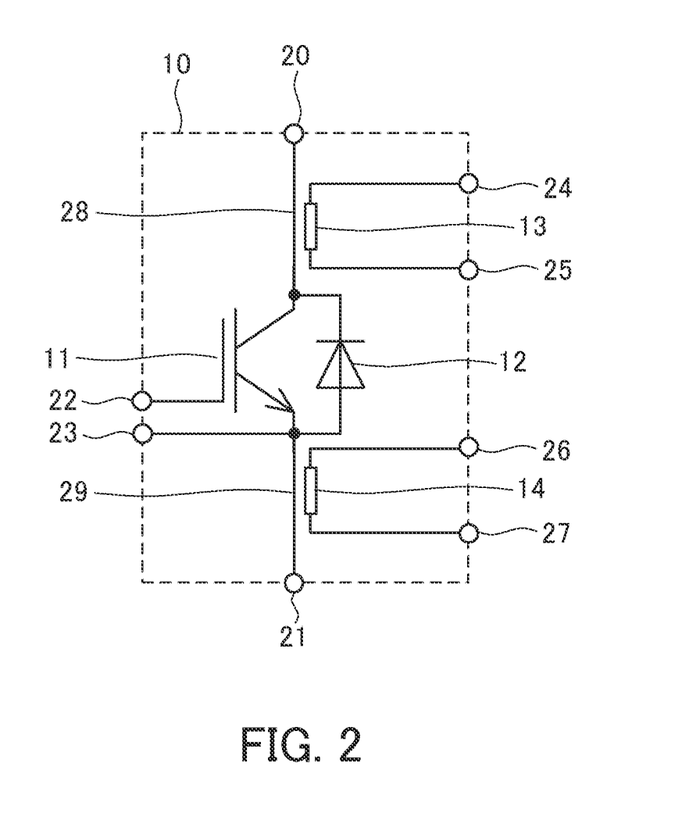
FIG. 2 is a circuit diagram of the power semiconductor module according to the first embodiment.

FIG. 1 is a plan view illustrating an example of an internal configuration of a power semiconductor module according to a first embodiment. FIG. 2 is a circuit diagram of the power semiconductor module according to the first embodiment.

As illustrated in FIGS. 1 and 2, this power semiconductor module 10 according to the first embodiment includes an IGBT 11, a free wheeling diode (FWD) 12, and two corrosion sensors 13 and 14. The IGBT 11 and the FWD 12 are mounted on an insulating substrate 15. Namely, a circuit pattern 16 is formed on one surface of the insulating substrate 15, and the IGBT 11 and the FWD 12 are bonded to the circuit pattern 16 via solder. The IGBT 11 has a collector terminal, which is a high-potential-side main electrode and is bonded to the circuit pattern 16 via solder. The FWD 12 has a cathode terminal bonded to the circuit pattern 16 via solder.

In addition, circuit patterns 17 and 18 are formed on the insulating substrate 15. One terminal of the corrosion sensor 13 is connected to the circuit pattern 17, and one terminal of the corrosion sensor 14 is connected to the circuit pattern 18. This insulating substrate 15 is housed in a case 19. On the frame of the case 19, there are formed a high-potential-side external terminal 20, a low-potential-side external terminal 21, external terminals 22 and 23 for inputting control signals, and external terminals 24 to 27 for the corrosion sensors 13 and 14.

The high-potential-side external terminal 20 is connected to the circuit pattern 16 via a plurality of bonding wires 28, which are wiring members. When a main current having a large current capacity is caused to flow through the bonding wires 28, several dozens of bonding wires 28 may be used. Thus, in the individual drawing illustrating an example of an internal configuration of a power semiconductor module, for simplicity, a single thick line having black circles at both ends represents a plurality of bonding wires. The low-potential-side external terminal 21 is connected to the anode terminal of the FWD 12 via a plurality of bonding wires 29, and the anode terminal of FWD 12 is connected to an emitter terminal of the IGBT 11, which is a low-potential-side main electrode thereof, via a plurality of bonding wires 30. In this way, the FWD 12 and the IGBT 11 are connected in reverse parallel with each other.

The circuit pattern 17, to which one terminal of the corrosion sensor 13 is connected, is connected to the external terminal 24 via a bonding wire 31, and the other terminal of the corrosion sensor 13 is connected to the external terminal 25. The circuit pattern 18, to which one terminal of the corrosion sensor 14 is connected, is connected to the external terminal 26 via a bonding wire 32, and the other terminal of the corrosion sensor 14 is connected to the external terminal 27.

The external terminal 22 is connected to a gate pad 33 of the IGBT 11 via a bonding wire 34, and the external terminal 23 is connected to the emitter terminal of the IGBT 11 via a bonding wire 35.

The corrosion sensor 13 is disposed near the bonding wires 28 through which a main current is inputted, and the corrosion sensor 14 is disposed near the bonding wires 29 through which a main current is outputted. Specifically, the corrosion sensor 13 is disposed in an installation environment of the bonding wire 28, such as in a vicinity of the bonding wire 28 having a same condition with respect to corrosion of the bonding wire 28, so as to detect the corrosion of the bonding wire 28. The corrosion sensor 14 is disposed in an installation environment of the bonding wire 29, such as in a vicinity of the bonding wire 29 having a same condition with respect to corrosion of the bonding wire 29, so as to detect corrosion of the bonding wire 29. Namely, the corrosion sensors 13 and 14 are disposed in high-temperature environments in which heat is generated when the main currents flow through the bonding wires 28 and 29. When corrosive gas has permeated the power semiconductor module 10, the corrosion sensors 13 and 14 exhibit corrosion reaction with the bonding wires 28 and 29.

Herein, the corrosion sensors 13 and 14 use metal resistive wires as resistive elements, and the resistance values of these metal resistive wires rise as the corrosion progresses. The material of the metal resistive wires is selected based on the material of the bonding wires 28 and 29. Namely, when the bonding wires 28 and 29 are made of aluminum, aluminum or an aluminum alloy is used as the material of the metal resistive wires. When the bonding wires 28 and 29 are made of copper, copper or a copper alloy is used as the material of the metal resistive wires. The metal resistive wires are formed to have a cross section that achieves a current density higher than that of the bonding wires 28 and 29. In this way, the resistance values of the metal resistive wires are adjusted to be higher than those of the bonding wires 28 and 29.

As described above, the corrosion sensors 13 and of this power semiconductor module 10 include metal resistive wires. Thus, the corrosion sensors 13 and 14 are easily and inexpensively installable even in a small module.

In addition, since the corrosion sensors 13 and 14 of this power semiconductor module 10 have terminals connectable to external circuits, the corrosion state in the module is determined by the external circuits. The external circuits determine the corrosion state in the module by using at least one of the corrosion sensors 13 and 14, as needed.

Second Embodiment

Figure 3:
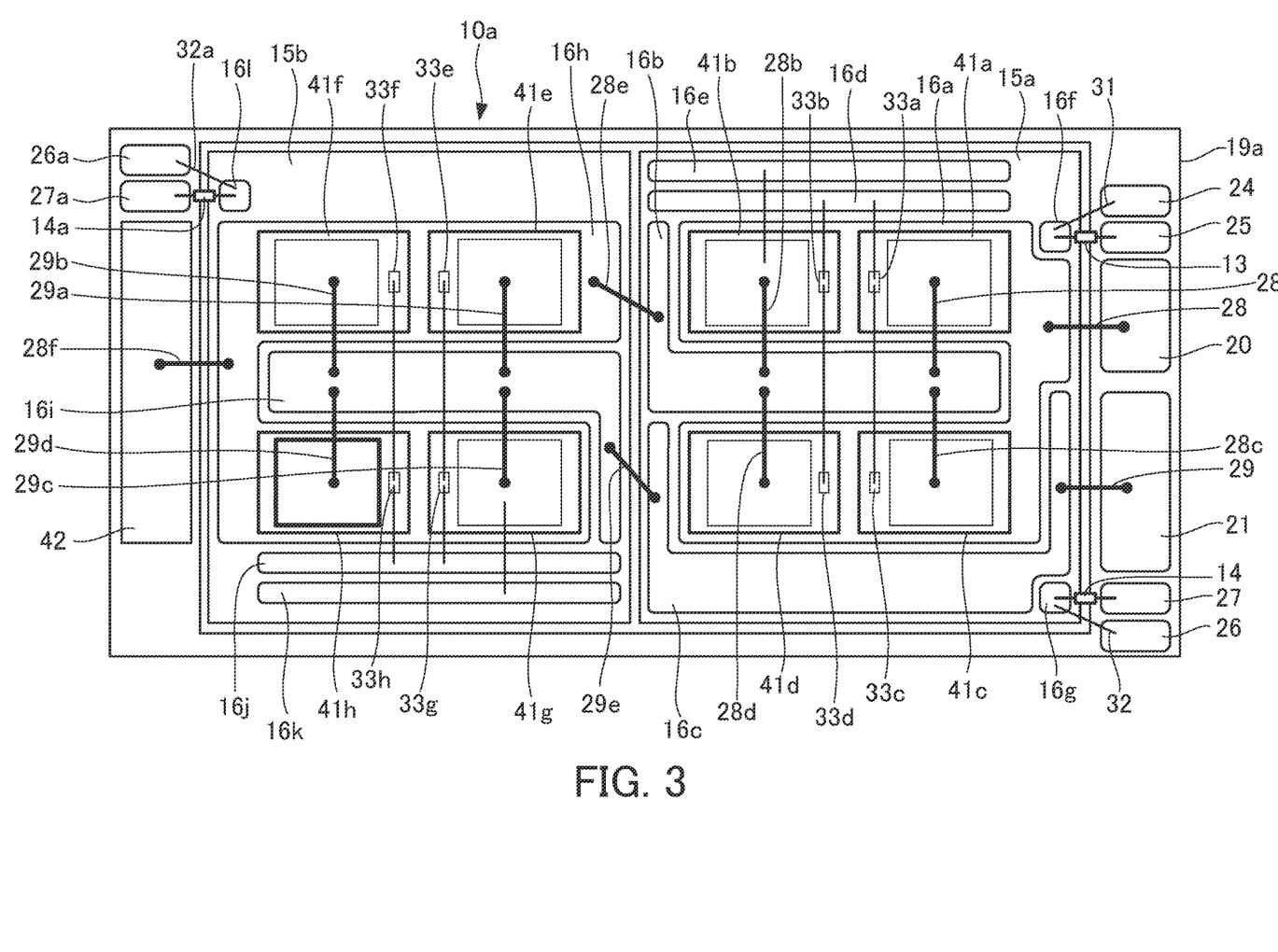
FIG. 3 is a plan view illustrating an example of an internal configuration of a power semiconductor module according to a second embodiment.
Figure 4:
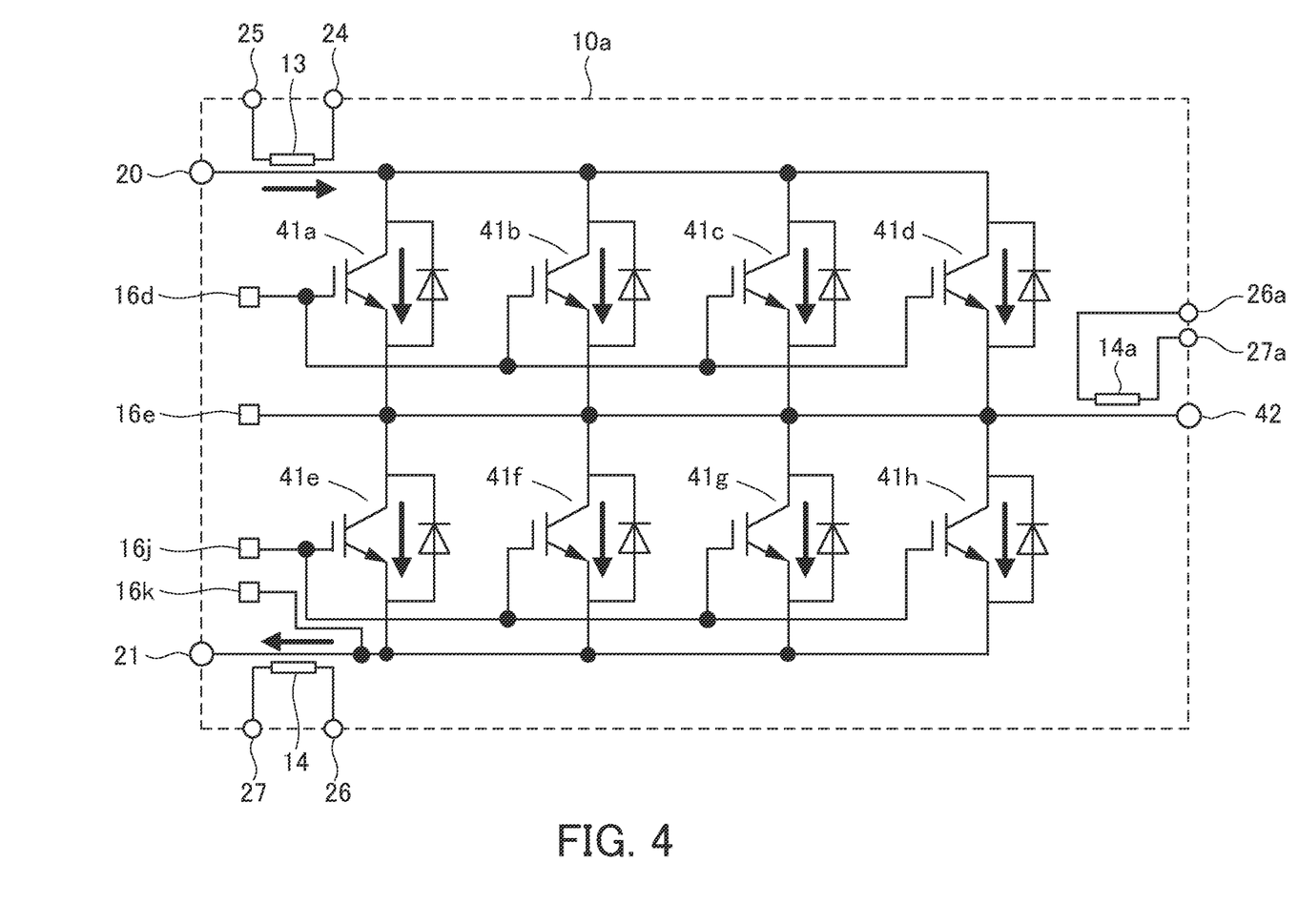
FIG. 4 is a circuit diagram of the power semiconductor module according to the second embodiment.

FIG. 3 is a plan view illustrating an example of an internal configuration of a power semiconductor module according to a second embodiment. FIG. 4 is a circuit diagram of the power semiconductor module according to the second embodiment. The material of the metal resistive wires and the resistance value adjustment method are the same as those according to the first embodiment.

In the case of this power semiconductor module 10a according to the second embodiment, an individual half-bridge circuit formed by connecting two power semiconductors in series with each other is provided with corrosion sensors 13 and 14. As illustrated in the circuit diagram in FIG. 4, in the case of this power semiconductor module 10a, four high-side power semiconductors of the half-bridge circuits are connected in parallel with each other. Likewise, four low-side power semiconductors of the half-bridge circuits are connected in parallel with each other. This connection increases the capacities of the source and sink currents. In addition, a reverse-conducting IGBT (RC-IGBT) is used as a power semiconductor. Specifically, an IGBT and an FWD are connected to form an individual RC-IGBT as a single element. Thus, the power semiconductor module 10a includes eight elements, as illustrated in FIG. 3.

This power semiconductor module 10a includes a high-side insulating substrate 15a and a low-side insulating substrate 15*b*, and these insulating substrates 15*a* and 15*b* are housed in a case 19*a*. Circuit patterns 16*a* to 16*g* are formed on the high-side insulating substrate 15*a*, and circuit patterns 16*h* to 16*l* are formed on the low-side insulating substrate 15*b*.

RC-IGBTs 41*a* to 41*d* are mounted on the circuit pattern 16*a* on the high-side insulating substrate 15*a*, and RC-IGBTs 41*e* to 41*h* are mounted on the circuit pattern 16*h* on the low-side insulating substrate 15*b*.

A high-potential-side external terminal 20, a low-potential-side external terminal 21, external terminals 24 and 25 for the corrosion sensor 13, external terminals 26 and 27 for the corrosion sensor 14, an output external terminal 42, and external terminals 26*a* and 27*a* for a corrosion sensor 14*a* are formed on the frame of the case 19*a*.

The high-potential-side external terminal 20 is connected to the circuit pattern 16*a* via a plurality of bonding wires 28. The emitter terminals of the high-side RC-IGBTs 41*a* to 41*d* are connected to the circuit pattern 16*b* via a plurality of bonding wires 28*a* to 28*d*. The circuit pattern 16*b* is connected to the circuit pattern 16*h* formed on the low-side insulating substrate 15*b* via a plurality of bonding wires 28*e*.

The circuit pattern 16*h* is connected to the external terminal 42 via a plurality of bonding wires 28*f*. The emitter terminals of the low-side RC-IGBTs 41*e* to 41*h* are connected to the circuit pattern 16*i* via a plurality of bonding wires 29*a* to 29*d*. The circuit pattern 16*i* is connected to the high-side circuit pattern 16*c* via a plurality of bonding wires 29*e*, and the circuit pattern 16*c* is connected to the low-potential-side external terminal 21 via a plurality of bonding wires 29.

The high-side circuit pattern 16*d* is connected to gate pads 33*a* to 33*d* of the high-side RC-IGBTs 41*a* to 41*d* via bonding wires. The circuit pattern 16*e* is connected to the emitter terminal of the high-side RC-IGBT 41*b* via a bonding wire. The low-side circuit pattern 16*j* is connected to gate pads 33*e* to 33*h* of the low-side RC-IGBTs 41*e* to 41*h* via bonding wires. The circuit pattern 16*k* is connected to the emitter terminal of the low-side RC-IGBT 41*g* via a bonding wire.

The circuit pattern 16*f*, to which one terminal of the corrosion sensor 13 is connected, is connected to the external terminal 24 via a bonding wire 31, and the other terminal of the corrosion sensor 13 is connected to the external terminal 25. The circuit pattern 16*g*, to which one terminal of the corrosion sensor 14 is connected, is connected to the external terminal 26 via a bonding wire 32, and the other terminal of the corrosion sensor 14 is connected to the external terminal 27. The circuit pattern 16*l*, to which one terminal of the corrosion sensor 14*a* is connected, is connected to the external terminal 26*a* via a bonding wire 32*a*, and the other terminal of the corrosion sensor 14*a* is connected to the external terminal 27*a*.

The corrosion sensor 13 is disposed near the bonding wire 28 through which a main current is inputted, and the corrosion sensor 14 is disposed near the bonding wire 29 through which a main current is outputted. The corrosion sensor 14*a* is disposed near the bonding wire 28*f* through which a main current is inputted and outputted. Specifically, the corrosion sensor 14*a* is disposed in an installation environment of the bonding wire 28*f*, such as in a vicinity of the bonding wire 28*f* having a same condition of corrosion of the bonding wire 28*f*, so as to detect the corrosion of the bonding wire 28*f*. In this way, the corrosion sensors 13, 14, and 14*a* are disposed in high-temperature environments in which heat is generated when the large currents flow through the bonding wires 28, 29, and 28*f*. When corrosive gas has permeated the power semiconductor module 10*a*, the corrosion sensors 13, 14, and 14*a* exhibit corrosion reaction with the bonding wires 28, 29, and 28*f*.

The corrosion sensors 13, 14, and 14*a* of this power semiconductor module 10*a* also have terminals connectable to external circuits. Thus, the corrosion state in the module is determined by observing change in the resistance values of the corrosion sensors 13, 14, and 14*a* with the external circuits.

Third Embodiment

Figure 5:
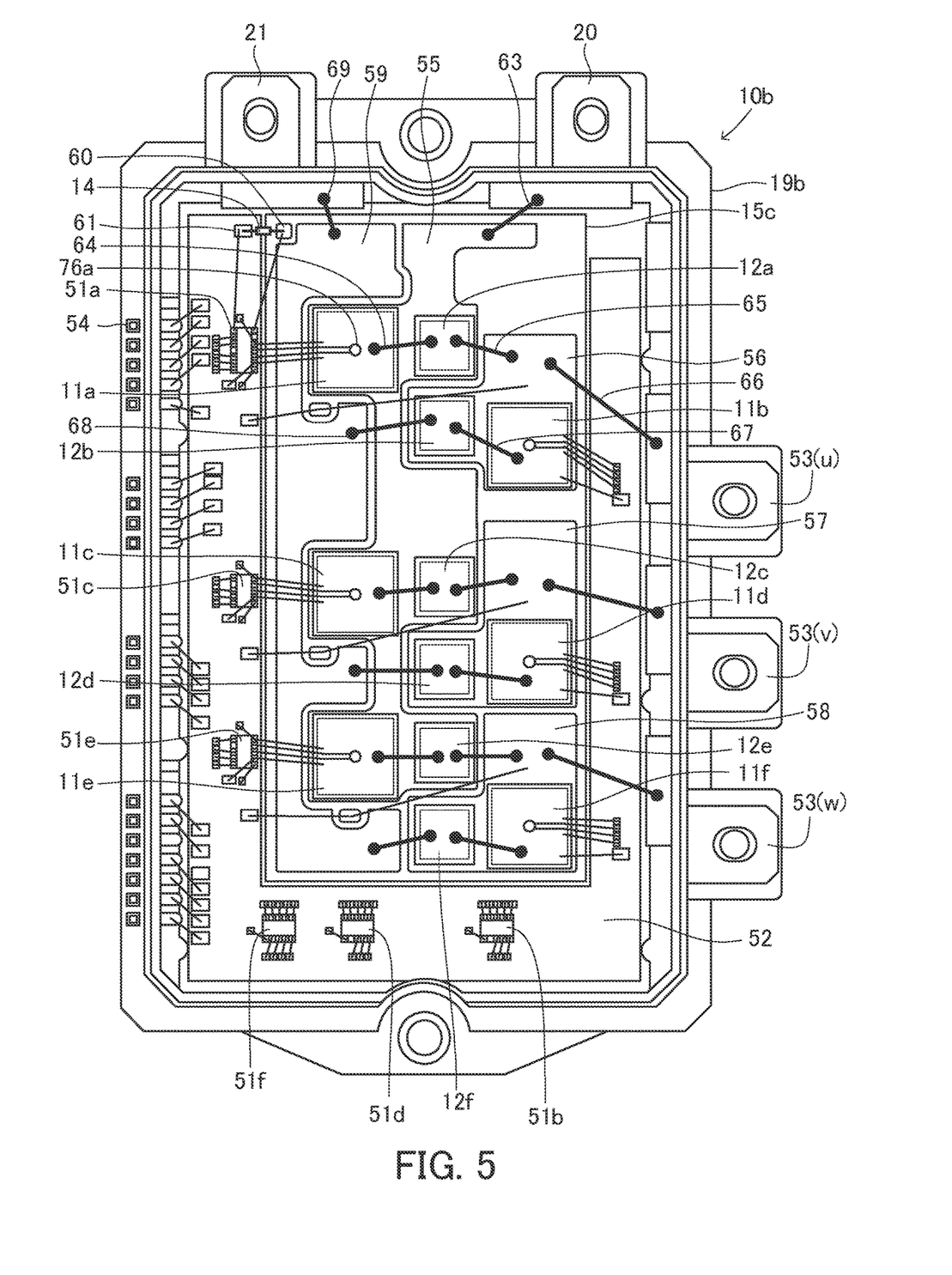
FIG. 5 is a plan view illustrating an example of an internal configuration of a power semiconductor module according to a third embodiment.
Figure 6:
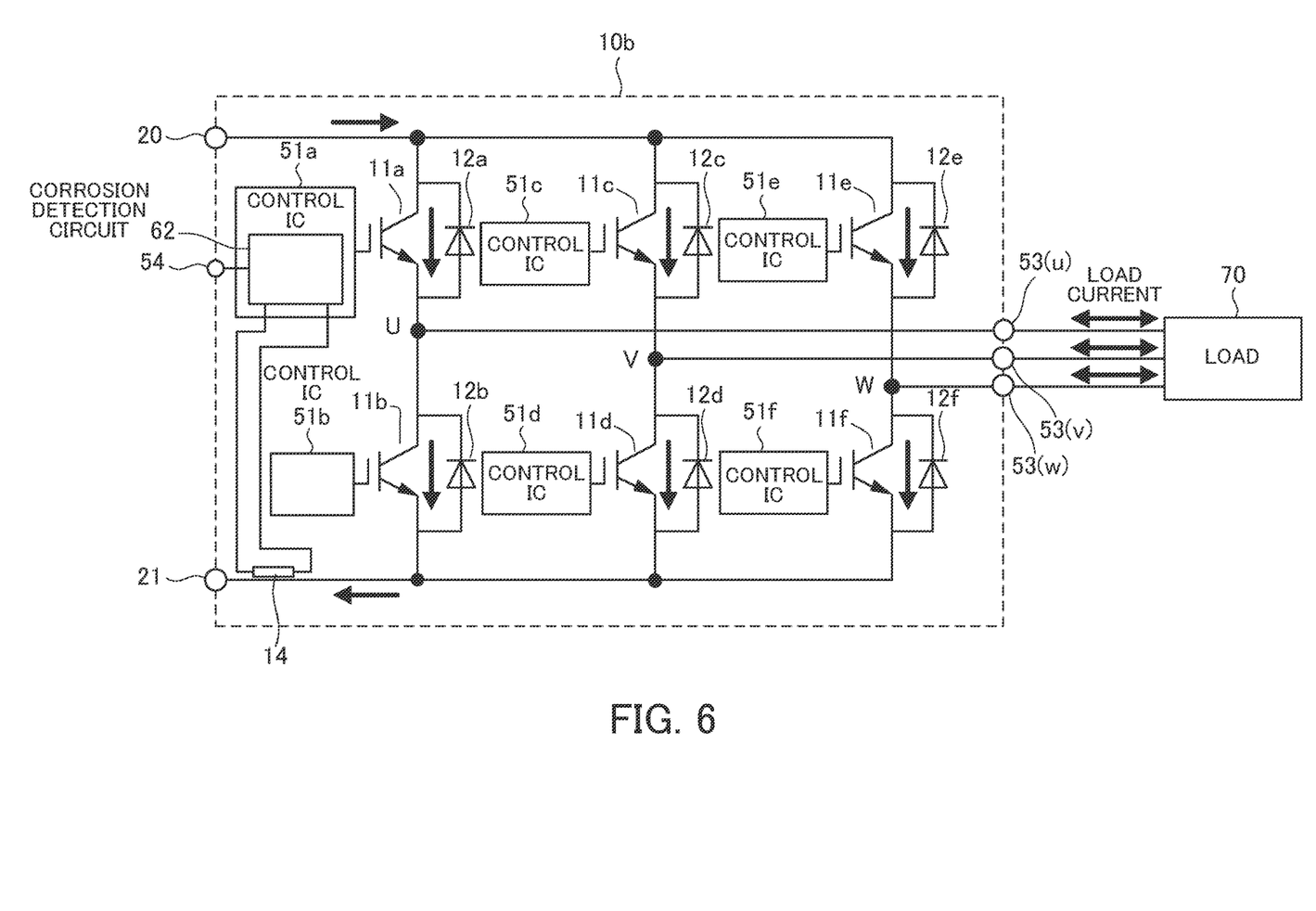
FIG. 6 is a circuit diagram of the power semiconductor module according to the third embodiment.
Figure 7:
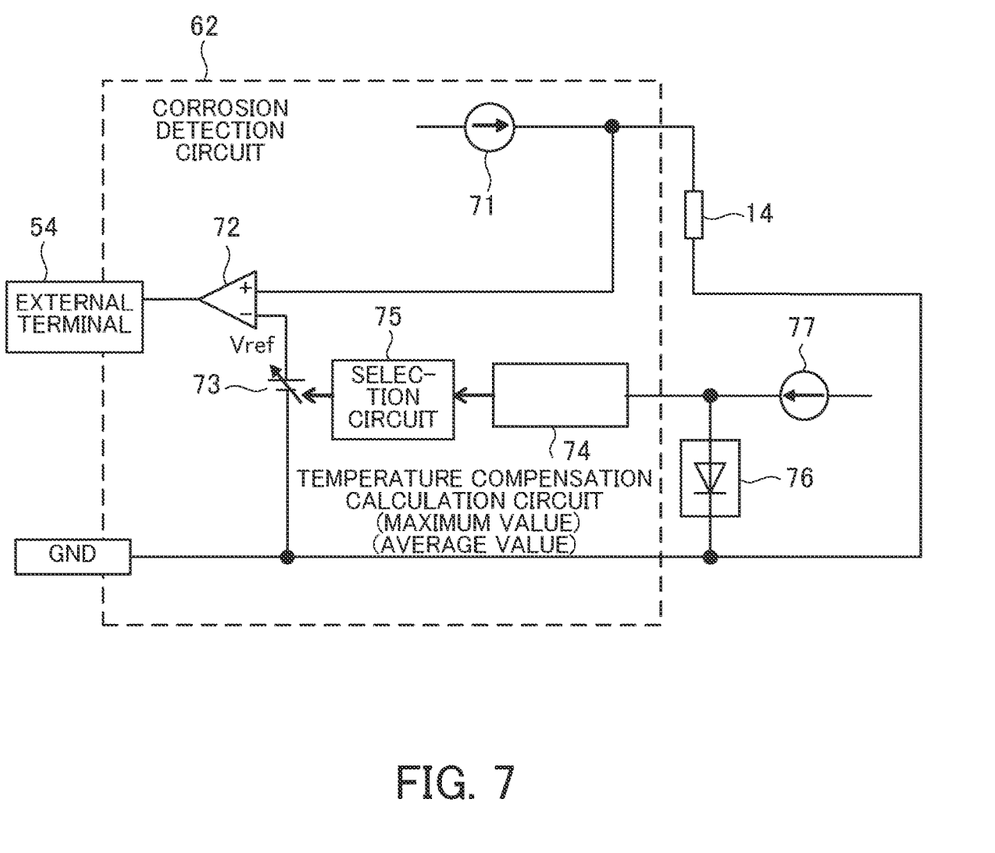
FIG. 7 is a circuit diagram of a corrosion detection circuit.

FIG. 5 is a plan view illustrating an example of an internal configuration of a power semiconductor module according to a third embodiment. FIG. 6 is a circuit diagram of the power semiconductor module according to the third embodiment. FIG. 7 is a circuit diagram of a corrosion detection circuit. The material of the metal resistive wires and the resistance value adjustment method are the same as those according to the first embodiment.

This power semiconductor module 10*b* according to the third embodiment is an IPM that drives load such as a three-phase motor, and three sets of half-bridge circuits are provided with a corrosion sensor 14. Thus, this power semiconductor module 10*b* includes control integrated circuit (IC) 51*a* to 51*f*, each of which drives a power semiconductor constituting a half-bridge circuit and has a circuit for protecting abnormalities such as overheat and overcurrent. The power semiconductors constituting their respective half-bridge circuits are IGBTs 11*a* to 11*f*, and the IGBTs 11*a* to 11*f* are connected in reverse parallel with FWDs 12*a* to 12*f*, respectively.

This power semiconductor module 10*b* includes an insulating substrate 15*c*, a printed substrate 52 disposed around three peripheral sides of the insulating substrate 15*c*, the corrosion sensor 14, and a case 19*b* in which the insulating substrate 15*c* and the printed substrate 52 are housed. The case 19*b* includes an external terminal 20, which is a high-potential-side input terminal, an external terminal 21, which is a low-potential-side input terminal, external terminals 53(*u*), 53(*v*), and 53(*w*), which are three-phase output terminals, and an external terminal 54, which is an alarm output terminal used when corrosion is detected.

As illustrated in FIG. 5, a long circuit pattern 55 extending vertically in FIG. 5, three circuit patterns 56 to 58 lined vertically in FIG. 5, a long circuit pattern 59 extending vertically in FIG. 5, and a circuit pattern 60 for the corrosion sensor 14 are formed on the insulating substrate 15*c*.

The IGBT 11*a* and the FWD 12*a*, the IGBT 11*c* and the FWD 12*c*, and the IGBT 11*e* and the FWD 12*e* are mounted on the circuit pattern 55. The IGBT 11b and the FWD 12*b* are mounted on the circuit pattern 56, and the IGBT 11*d* and the FWD 12*d* are mounted on the circuit pattern 57. The IGBT 11*f* and the FWD 12*f* are mounted on the circuit pattern 58.

The control ICs 51*a* to 51*f* for controlling the IGBTs 11*a* to 11*f*, respectively, are mounted on the printed substrate 52. In addition, a circuit pattern 61 for the corrosion sensor 14 is formed on the printed substrate 52. The control IC 51*a* closest to the installation location of the corrosion sensor 14 includes a corrosion detection circuit 62 illustrated in FIG. 6.

The high-potential-side external terminal 20 is connected to the circuit pattern 55 via a plurality of bonding wires 63. The anode terminal of the FWD 12*a* mounted on the circuit pattern 55 is connected to the emitter terminal of the IGBT 11*a* via a plurality of bonding wires 64 and is also connected to the circuit pattern 56 via a plurality of bonding wires 65.

The circuit pattern 56 is connected to the external terminal 53(*u*) via a plurality of bonding wires 66. The anode terminal of the FWD 12*b* mounted on the circuit pattern 56 is connected to the emitter terminal of the IGBT 11*b* via a plurality of bonding wires 67 and is also connected to the circuit pattern 59 via a plurality of bonding wires 68.

Likewise, the anode terminal of the FWD 12*c* mounted on the circuit pattern 55 is connected to the emitter terminal of the IGBT 11*c* and the circuit pattern 57. The circuit pattern 57 is connected to the external terminal 53(*v*). The anode terminal of the FWD 12*d* mounted on the circuit pattern 57 is connected to the emitter terminal of the IGBT 11*d* and the circuit pattern 59.

The anode terminal of the FWD 12*e* mounted on the circuit pattern 55 is connected to the emitter terminal of the IGBT 11*e* and the circuit pattern 58. The circuit pattern 58 is connected to the external terminal 53(*w*). The anode terminal of the FWD 12*f* mounted on the circuit pattern 58 is connected to the emitter terminal of the IGBT 11*f* and the circuit pattern 59.

In addition, the circuit pattern 59 is connected to the low-potential-side external terminal 21 via a plurality of bonding wires 69. The external terminals 53(*u*), 53(*v*), and 53(*w*) are connected to load 70.

The corrosion sensor 14 is disposed near the plurality of bonding wires 69 connecting the circuit pattern 59 and the low-potential-side external terminal 21. Namely, the corrosion sensor 14 is disposed in a high-temperature environment in which heat is generated when a main current flows through the plurality of bonding wires 69. The corrosion sensor 14 is connected to the control IC 51*a*.

The control IC 51*a* includes the corrosion detection circuit 62 as illustrated in FIG. 7. The corrosion detection circuit 62 includes a constant current circuit 71, a comparator 72, a reference voltage source 73, a temperature compensation calculation circuit 74, and a selection circuit 75. The constant current circuit 71 has an output terminal connected to one terminal of the corrosion sensor 14. The other terminal of the corrosion sensor 14 is connected to a ground (GND) terminal of this corrosion detection circuit 62. The temperature compensation calculation circuit 74 has an input terminal connected to the temperature sensor 76 and the constant current circuit 77. A temperature detection diode 76*a* used in an overheat protection circuit integrally formed with the IGBT 11*a* may be used as the temperature sensor 76. In this case, a constant current circuit arranged in an overheat protection circuit of the control IC 51*a* is used as the constant current circuit 77. In addition, the temperature compensation calculation circuit 74 is able to acquire not only a temperature signal detected by the temperature detection diode 76*a* of the IGBT 11*a* but also temperature signals detected by the temperature detection diodes formed in the other respective IGBTs lib to 11*f* from the control ICs 51*b* to 51*f*.

In the corrosion detection circuit 62, the output terminal of the constant current circuit 71 is connected to the non-inverting input terminal of the comparator 72, and the inverting input terminal of the comparator 72 is connected to the positive terminal of the reference voltage source 73 that outputs a reference voltage Vref. The negative terminal of the reference voltage source 73 is connected to the ground (GND) terminal of this corrosion detection circuit 62. The reference voltage Vref of the reference voltage source 73 is variable, and the value of the reference voltage Vref is calculated by the temperature compensation calculation circuit 74. The temperature compensation calculation circuit 74 has a function of calculating and holding the maximum value and the average value of the temperature detected by the temperature sensor 76. The selection circuit 75 selects either the maximum value or the average value, depending on the need.

In this way, the corrosion detection circuit 62 is able to set the reference voltage Vref based on the ambient temperature environment. For example, when the reference voltage Vref is set to a voltage corresponding to the maximum value of the detected temperature and when use of the power semiconductor module 10*b* increases the ambient temperature, the reference voltage Vref may be changed from the maximum value to the average value. Of course, the selection circuit 75 may select a fixed value previously set in the temperature compensation calculation circuit 74.

In this corrosion detection circuit 62, the comparator 72 compares the detected voltage across the corrosion sensor 14 with the reference voltage Vref of the reference voltage source 73 while the constant current circuit 71 is flowing a constant current through the corrosion sensor 14. Since the resistance value of the corrosion sensor 14 is small when corrosion is not detected, the constant current supplied by the constant current circuit 71 undergoes a small voltage drop, and the detected voltage is also sufficiently small. Thus, the comparator 72 outputs a ground-level signal.

As the corrosion of the corrosion sensor 14 progresses and the resistance value of the corrosion sensor rises, the voltage across the corrosion sensor 14 also rises. When the detected voltage exceeds the reference voltage Vref, the comparator 72 outputs a high-level alarm signal. This alarm signal notifies, via the external terminal 54, an external element that the corrosion has progressed and reached a predetermined value inside the power semiconductor module 10*b*.

The constant current circuit 71 in the corrosion detection circuit 62 constantly flows a constant current while the power semiconductor module 10*b* is operating. However, the current generated by the constant current circuit 71 is, for example, on the order of some dozens of μ amperes. Namely, the current is small enough to ignore with respect to a main current that flows on the order of some hundreds of amperes, for example. Thus, the current does not particularly cause any problems.

The power semiconductor module having the above configuration is advantageous in that a first corrosion sensor, a second corrosion sensor, or a third corrosion sensor is easily installable in a small space in an environment where a first wiring member, a second wiring member, or a third wiring member that generates heat when a large current flows is installed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A power semiconductor module, comprising:
a first external terminal, a second external terminal, and a third external terminal;
a half-bridge circuit including a first power semiconductor element and a second power semiconductor element that are connected in series with each other between the first external terminal and the second external terminal;
a first wiring member that connects a high-potential-side main electrode of the first power semiconductor element to the first external terminal;
a second wiring member that connects a low-potential-side main electrode of the second power semiconductor element to the second external terminal;
a third wiring member that connects an output of the half-bridge circuit to the third external terminal; and
a first corrosion sensor disposed in a vicinity of the first wiring member for detecting corrosion of the first wiring member, a second corrosion sensor disposed in a vicinity of the second wiring member for detecting corrosion of the second wiring member, and a third corrosion sensor disposed in a vicinity of the third wiring member for detecting corrosion of the third wiring member.

2. The power semiconductor module according to claim 1, wherein the first corrosion sensor, the second corrosion sensor, and the third corrosion sensor are made of materials corresponding to materials of the first wiring member, the second wiring member and the third wiring member, respectively, the first wiring member, the second wiring member, and the third wiring member being made of a material selected one from a group including aluminum, an aluminum alloy, copper, and a copper alloy.

3. The power semiconductor module according to claim 1, wherein each of the first corrosion sensor, the second corrosion sensor, and the third corrosion sensor is made of a resistive wire having a cross section area that achieves a current density higher than a current density of a corresponding one of the first wiring member, the second wiring member, and the third wiring member.

4. The power semiconductor module according to claim 1, wherein the at least one of the first corrosion sensor, the second corrosion sensor or the third corrosion sensor outputs a detection signal of the corrosion,
the power semiconductor module further comprising another external terminal for outputting the detection signal to an external element, wherein
the at least one of the first corrosion sensor, the second corrosion sensor or the third corrosion sensor is connected to the another external terminal.

5. The power semiconductor module according to claim 1, wherein the at least one of the first corrosion sensor, the second corrosion sensor or the third corrosion sensor includes the first corrosion sensor and the second corrosion sensor,
the power semiconductor module further comprising a corrosion detection circuit that outputs an alarm signal upon an output value of the first corrosion sensor or the second corrosion sensor exceeding a predetermined value.

6. The power semiconductor module according to claim 5, further comprising a control circuit that controls switching of the first and second power semiconductor elements.

7. The power semiconductor module according to claim 6, wherein the corrosion detection circuit is incorporated in the control circuit.

8. The power semiconductor module according to claim 7, wherein the corrosion detection circuit includes
a constant current circuit that supplies a constant current to the first corrosion sensor or the second corrosion sensor,
a reference voltage source that outputs a reference voltage corresponding to the predetermined value, and
a comparator that compares a voltage across the first corrosion sensor or the second corrosion sensor with the reference voltage.

9. The power semiconductor module according to claim 8, further comprising a temperature sensor, wherein
the corrosion detection circuit further includes a temperature compensation calculation circuit that sets a value of the reference voltage based on a temperature detected by the temperature sensor.

10. The power semiconductor module according to claim 9, wherein the temperature compensation calculation circuit calculates and holds a maximum value of the detected temperature, and sets the value of the reference voltage using the maximum value of the detected temperature.

11. The power semiconductor module according to claim 9, wherein the temperature compensation calculation circuit calculates and holds an average value of the detected temperature, and sets the value of the reference voltage using the average value of the detected temperature.

12. The power semiconductor module according to claim 9,
wherein the temperature compensation calculation circuit includes a maximum value holding unit that calculates and holds a maximum value of the detected temperature and an average value holding unit that calculates and holds an average value of the detected temperature, and
wherein the corrosion detection circuit further includes a selection circuit that selects an output of the maximum value holding unit or the average value holding unit, and sets the value of the reference voltage based on the selected output.

13. A power semiconductor module, comprising:
a power semiconductor element having a high-potential-side main electrode and a low-potential-side main electrode;
a first external terminal;
a second external terminal;
a first wiring member that connects the high-potential-side main electrode to the first external terminal;
a second wiring member that connects the low-potential-side main electrode to the second external terminal; and
a first corrosion sensor disposed in a vicinity of the first wiring member for detecting corrosion of the first wiring member and a second corrosion sensor disposed in a vicinity of the second wiring member for detecting corrosion of the second wiring member.

14. The power semiconductor module according to claim 1, wherein the half-bridge circuit is provided in plurality, and the plurality of the half-bridge circuits are connected in parallel to one another between the first external terminal and the second external terminal.

* * * * *